(12) United States Patent
Jeong

(10) Patent No.: US 9,312,843 B2
(45) Date of Patent: Apr. 12, 2016

(54) COMPARISON CIRCUIT AND IMPEDANCE CALIBRATION CIRCUIT USING THE SAME

(75) Inventor: Hyun Sik Jeong, Seoul (KR)

(73) Assignee: SK Hynix Inc., Icheon-si (KR)

( * ) Notice: Subject to any disclaimer, the term of this patent is extended or adjusted under 35 U.S.C. 154(b) by 1065 days.

(21) Appl. No.: 13/368,143

(22) Filed: Feb. 7, 2012

(65) Prior Publication Data

US 2013/0076399 A1    Mar. 28, 2013

(30) Foreign Application Priority Data

Sep. 23, 2011 (KR) ........................ 10-2011-0096452

(51) Int. Cl.
*H03K 5/24*    (2006.01)

(52) U.S. Cl.
CPC ..................... *H03K 5/249* (2013.01)

(58) Field of Classification Search
None
See application file for complete search history.

(56) References Cited

U.S. PATENT DOCUMENTS 7,439,762 B2 * 10/2008 Lee .................................. 326/30
2007/0164780 A1 * 7/2007 Lee .................................. 326/30

FOREIGN PATENT DOCUMENTS

KR      100681879 B1    2/2007

\* cited by examiner

*Primary Examiner* — Melissa Koval
*Assistant Examiner* — Courtney McDonnough
(74) *Attorney, Agent, or Firm* — William Park & Associates Ltd.

(57) ABSTRACT

A comparison circuit includes: an offset removal unit configured to store offset information of a comparator in response to a reference voltage, and compare a pad voltage with the reference voltage based on the offset information to drive a first node; and a comparison signal output unit configured to buffer a signal of the first node and output a comparison signal.

23 Claims, 4 Drawing Sheets

COMPARISON CIRCUIT AND IMPEDANCE CALIBRATION CIRCUIT USING THE SAME

CROSS-REFERENCES TO RELATED APPLICATIONS

The present application claims priority under 35 U.S.C 119(a) to Korean Application No. 10-2011-0096452, filed on Sep. 23, 2011, in the Korean intellectual property Office, which is incorporated herein by reference in its entirety as set forth in full.

BACKGROUND

A reception terminal or transmission terminal of an integrated circuit is coupled to a termination resistor having the same resistance value as characteristic impedance of a transmission channel. The termination resistor matches impedance of the reception terminal or transmission terminal with the characteristic impedance of the transmission channel, thereby suppressing reflection of signals transmitted through the transmission channel. Conventionally, the termination resistor has been installed outside a semiconductor chip. Recently, however, an on-die termination (ODT) circuit having a termination resistor installed inside a semiconductor chip has been used. The ODT circuit includes a switching circuit configured to control a current flowing therein through an on/off operation. Therefore, the ODT circuit requires smaller power consumption than a termination resistor installed outside a chip. The ODT circuit has a resistance value which changes depending on a PVT (Process, Voltage, and Temperature) variation. Therefore, before the ODT circuit is used, an impedance calibration circuit is applied to calibrate the resistance value of the ODT circuit.

The impedance calibration circuit includes a comparator configured to compare a resistance value of an external resistor coupled to a ZQ pad with a reference voltage, and the impedance calibration circuit generates a pull-up code and a pull-down code for calibrating the resistance value of the ODT circuit. Here, the external resistor coupled to the ZQ pad has a constant resistance value (generally, 240Ω) regardless of a PVT variation.

Meanwhile, the comparator may be used in an integrated circuit as well as the above-described calibration circuit, and performs an operation of comparing input voltages to output a logic level. However, an offset occurring in the comparator during a wafer manufacturing process may cause an error in the operation of the comparator to compare the input voltages. Furthermore, when the comparator in which an offset occurred is used in an impedance calibration circuit, impedance mismatching occurs, which makes it difficult to transmit data at high speed. Furthermore, output data may be distorted.

SUMMARY

An embodiment of the present invention relates to a comparison circuit and an impedance calibration circuit using the same, which are capable of removing an offset.

In one embodiment, a comparison circuit includes: an offset removal unit configured to store offset information of a comparator in response to a reference voltage, and compare a pad voltage with the reference voltage based on the offset information to drive a first node; and wherein the comparison circuit is further configured to buffer a signal of the first node and output a comparison signal.

In another embodiment, an impedance calibration circuit includes: a comparison circuit configured to receive first to third period signals and generate a comparison signal by comparing a reference voltage and a pad voltage; and a counter configured to count a code for calibrating a resistance value of an ODT circuit in response to the comparison signal, and generate the first to third period signals.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
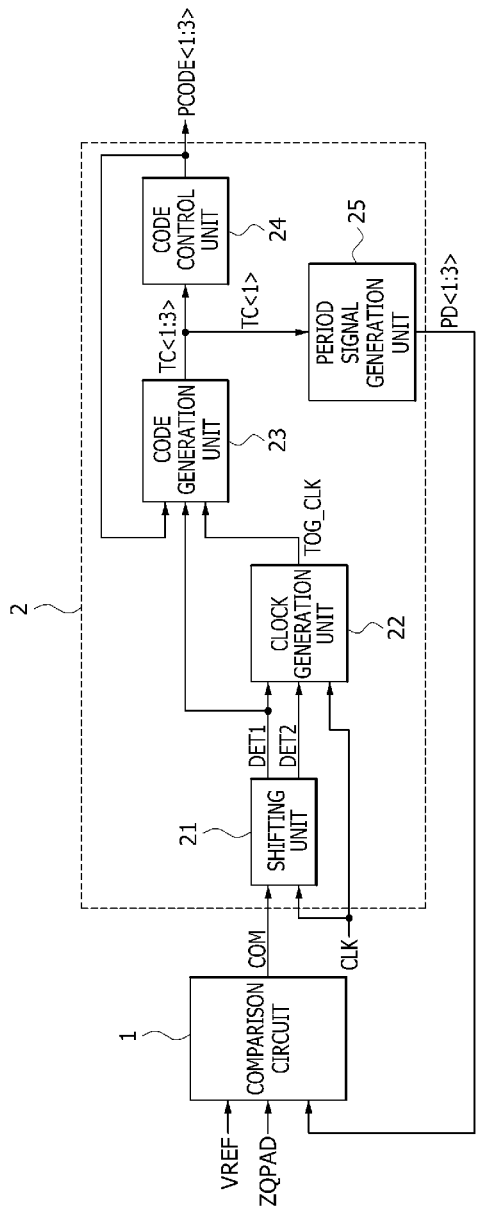
FIG. 1 is a block diagram of an impedance calibration circuit in accordance with an embodiment of the present invention.

FIG. 1 is a block diagram of an impedance calibration circuit in accordance with an embodiment of the present invention.

Referring to FIG. 1, the impedance calibration circuit in accordance with an embodiment of the present invention includes a comparison circuit 1 and a counter 2. The counter 2 includes a shifting unit 21, a clock generation unit 22, a code generation unit 23, a code control unit 24, and a period signal generation unit 25.

The comparison circuit 1 is configured to compare a reference voltage VREF with a pad voltage ZQPAD of a ZQ pad coupled to an external resistor and generate a comparison signal COM, in response to first to third period signal PD<1:3>. In this embodiment, the comparison signal COM is generated at a logic low level when the pad voltage ZQPAD is at a higher level than the reference voltage VREF, and generated at a logic high level when the pad voltage ZQPAD is at a lower level than the reference voltage VREF. The logic level of the comparison signal COM may be set in various manners depending on embodiments. The comparison circuit 1 includes a comparator (not illustrated) configured to compare the reference voltage VREF with the pad voltage ZQPAD. The comparator may include an operational amplifier (OP AMP). An offset of the comparator is removed while the comparison circuit 1 operates in response to the first to third period signals PD<1:3>. A configuration and operation of the comparison circuit 1 for removing an offset of the comparator will be described below with reference to FIG. 5.

The shifting unit 21 is configured to generate a first detection signal DET1 by buffering the comparison signal COM. The shifting unit 21 may also generate a second detection signal DET2 by shifting the comparison signal COM by one cycle of a clock signal CLK. The period by which the shifting unit 21 shifts the comparison signal COM to generate the second detection signal DET2 may be set in various manners depending on embodiments.

The clock generation unit 22 is configured to buffer the clock signal CLK and output the buffered signal as a toggling clock signal TOG_CLK, in a period where the levels of the first and second detection signals DET1 and DET2 are identical.

The code generation unit 23 is configured to generate first to third toggling codes TC<1:3> for increasing or decreasing a bit number of first to third codes PCODE<1:3> according to the level of the first detection signal DET1, whenever a pulse of the toggling clock signal TOG_CLK is inputted.

The code control unit 24 is configured to control the first to third codes PCODE<1:3> according to the first to third toggling codes TC<1:3>. More specifically, the code control unit 24 inverts the level of the first code PCODE<1> when a pulse of the first toggling code TC<1> is inputted, inverts the level of the second code PCODE<2> when a pulse of the second toggling code TC<2> is inputted, and inverts the level of the third code PCODE<3> when a pulse of the third toggling code TC<3> is inputted. Here, the first to third codes PCODE<1:3> are signals for calibrating a resistance value of an ODT circuit, or particularly, signals for controlling a pull-up drivability of the ODT circuit. A detailed configuration and operation of the period signal generation unit 25 will be described with reference to FIGS. 3 and 4.

Figure 2:
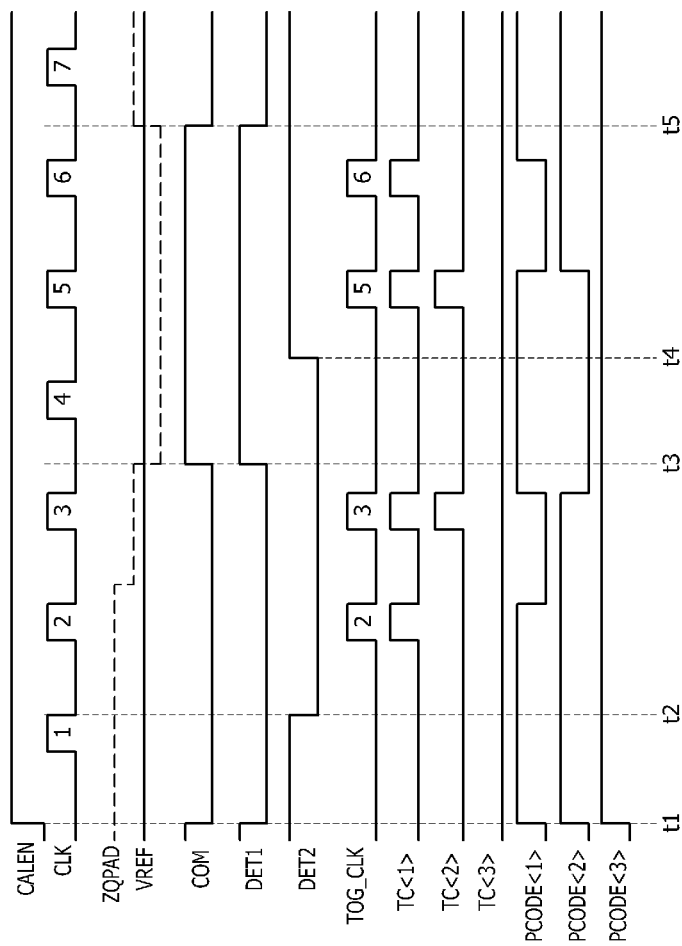
FIG. 2 is a timing diagram explaining operations of the impedance calibration circuit of FIG. 1.

The operation of the impedance calibration circuit configured in such a manner will be described in detail as follows with reference to FIG. 2. The impedance calibration circuit in accordance with an embodiment of the present invention performs an operation of calibrating a resistance value of the ODT circuit in a period where a calibration enable signal CALEN is enabled to a logic high level.

Hereafter, an operation of the impedance calibration circuit during a period t1~t3 where the pad voltage ZQPAD has a higher level than the reference voltage VREF will be described.

First, since the comparison signal COM outputted from the comparison circuit 1 is at a logic low level in the period t1~t3, the first detection signal DET1 outputted from the shifting unit 21 has a logic low level in the period t1~t3 and second detection signal DET2 has a logic low level in a period t2~t3.

The clock generation unit 22 buffers the clock signal CLK and outputs the buffered signal as the toggling clock signal TOG_CLK in the period t2~t3 where the levels of the first and second detection signals DET1 and DET2 are identical to each other as a logic low level.

The code generation unit 23 generates a pulse of the first toggling code TC<1> to decrease the bit number of the first to third codes PCODE<1:3> set to '1, 1, 1' by one bit according to the low-level first detection signal DET1, when a pulse 2 of the toggling clock signal TOG_CLK is inputted. Furthermore, the code generation unit 23 generates pulses of the first and second toggling codes TC<1:2> to decrease the bit number of the first to third codes PCODE<1:3> set to '0, 1, 1' by one bit according to the low-level first detection signal DET1, when a pulse 3 of the toggling clock signal TOG_CLK is inputted.

At this time, the code control unit 24 inverts the level of the first code PCODE<1> according to the pulse of the first toggling code TC<1> which is generated when the pulse 2 of the toggling clock signal TOG_CLK is inputted. Therefore, the bit number of the first to third code PCODE<1:3> set to '1, 1, 1' is decreased by one bit to '0, 1, 1'. Furthermore, the code control unit 24 inverts the levels of the first and second codes PCODE<1:2> according to the pulses of the first and second toggling codes TC<1:2> which are generated when the pulse 3 of the toggling clock signal TOG_CLK is inputted. Therefore, the bit number of the first to third codes PCODE<1:3> set to '0, 1, 1' is decreased by one bit to '1, 0, 1'.

Hereafter, an operation of the impedance calibration circuit during a period t3~t5 where the pad voltage ZQPAD is at a lower level than the reference voltage VREF will be described.

First, since the comparison signal COM outputted from the comparison circuit 1 is at a logic high level in the period t3~t5, the first detection signal DET1 outputted from the shifting unit 21 has a logic high level in the period t3~t5, and the second detection signal DET2 has a logic high level in a period t4~t5.

The clock generation unit 22 buffers the clock signal CLK and outputs the buffered signal as the toggling clock signal TOG_CLK in the period t4~t5 where the levels of the first and second detection signals DET1 and DET2 are identical to each other as a logic high level.

The code generation unit 23 generates pulses of the first and second toggling codes TC<1:2> to increase the bit number of the first to third codes PCODE<1:3> set to '1, 0, 1' by one bit according to the high-level first detection signal DET1, when a pulse 5 of the toggling pulse TOG_CLK is inputted. Furthermore, the code generation unit 23 generates a pulse of the first toggling code TC<1> to increase the bit number of the first to third codes PCODE<1:3> set to '0, 1, 1' by one bit according to the high-level first detection signal DET1, when a pulse 6 of the togging clock signal TOG_CLK is inputted.

At this time, the code control unit 24 inverts the levels of the first and second codes PCODE<1:2> according to the pulses of the first and second toggling codes TC<1:2> which are generated when the pulse 5 of the toggling clock signal TOG_CLK is inputted. Therefore, the bit number of the first to third codes PCODE<1:3> set to '1, 0, 1' is increased by one bit to '0, 1, 1'. Furthermore, the code control unit 24 inverts the level of the first code PCODE<1> according to the pulse of the first toggling code TC<1> which is generated when the pulse 6 of the toggling clock signal TOG_CLK is inputted. Therefore, the bit number of the first to third codes PCODE<1:3> set to '0, 1, 1' is increased by one bit to '1, 1, 1'.

Figure 3:
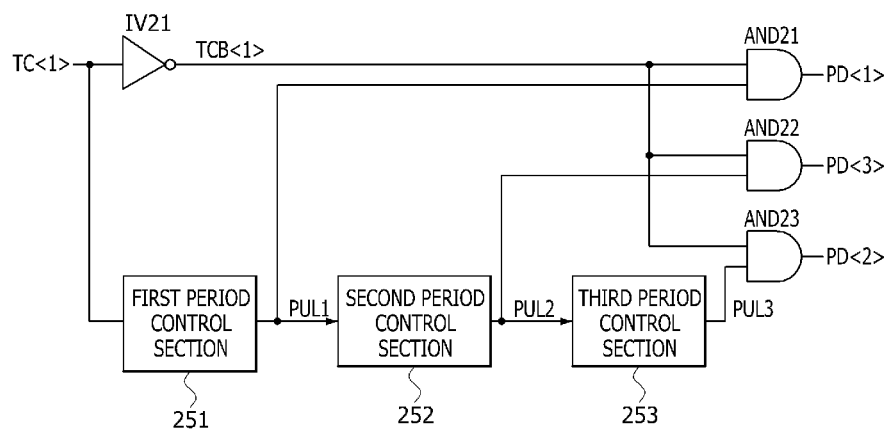
FIG. 3 is a circuit diagram of a period signal generation unit included in the impedance calibration circuit of FIG. 1.

FIG. 3 is a circuit diagram of the period signal generation unit included in the impedance calibration circuit of FIG. 1.

Referring to FIG. 3, the period signal generation unit 25 in accordance with the embodiment of the present invention includes an inverter IV21, a first period control section 251, a second period control section 252, a third period control section 253, an AND gate AND21, an AND gate AND22, and an AND gate AND23. The inverter IV21 is configured to invert and buffer the first toggling code TC<1> and generate an inverted first toggling code TCB<1>. The first period control section 251 is configured to generate a first pulse signal PUL1 having a pulse width which is larger by a first delay period td1 than the pulse width of the first toggling code TC<1>. The second period control section 252 is configured to receive the first pulse signal PUL1 and generate a second pulse signal PUL2 having a pulse width which is larger by a second delay period td2 than the pulse width of the first toggling code TC<1>. The third period control section 253 is configured to receive the second pulse signal PUL2 and generate a third pulse signal PUL3 having a pulse width which is larger by a third delay period td3 than the pulse width of the first toggling code TC<1>. The AND gate AND21 is configured to receive the first pulse signal PUL1 and the inverted first toggling code TCB<1> and generate the first period signal PD<1>. The AND gate AND22 is configured to receive the second pulse signal PUL2 and the inverted first toggling code TCB<1> and generate the third period signal PD<3>.

The AND gate AND23 is configured to receive the third pulse signal PUL3 and the inverted first toggling code TCB<1> and generate the second period signal PD<2>.

Figure 4:
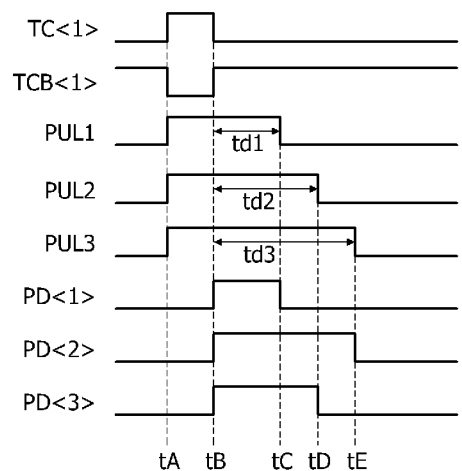
FIG. 4 is a timing diagram explaining operations of the period signal generation unit of FIG. 3.

The enable periods of the first to third period signals PD<1:3> generated by the period signal generation unit 25 configured in such a manner are set differently from each other. Referring to FIG. 4, all of the first to third period signals PD<1:3> are enabled at a time point tB. However, the first period signal PD<1> is disabled at a time point tC, the second period signal PD<2> is disabled at a time point tE, and the third period signal PD<3> is disabled at a time point tD. That is, the first enable period PD<1> has the shortest enable period, and the second enable period PD<2> has the longest enable period.

Figure 5:
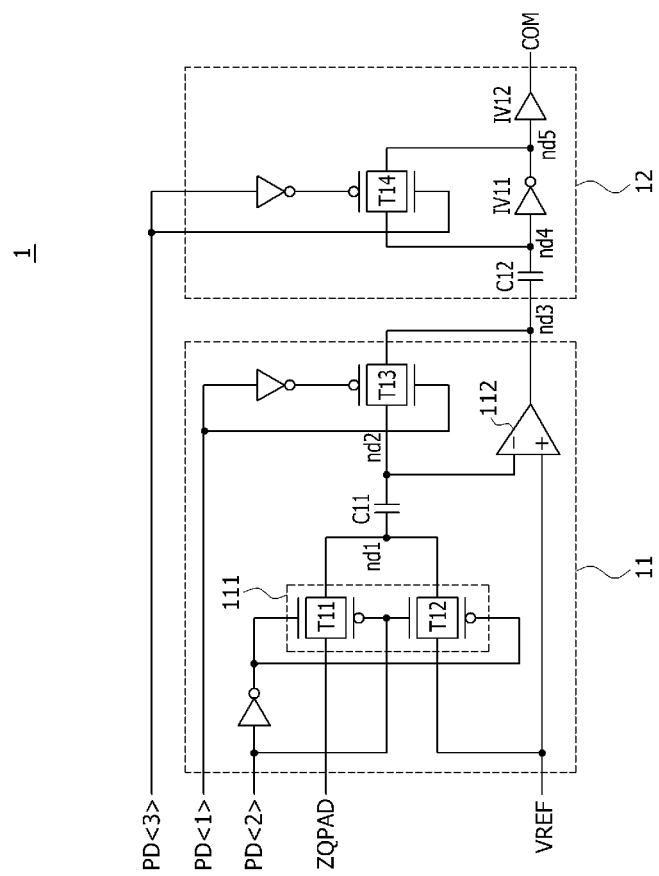
FIG. 5 is a circuit diagram of a comparison circuit included in the calibration circuit of FIG. 1.

FIG. 5 is a circuit diagram of a comparison circuit included in the impedance calibration circuit of FIG. 1.

Referring to FIG. 5, the comparison circuit 1 in accordance with an embodiment of the present invention includes an offset removal unit 11 and a comparison signal output unit 12.

The offset removal unit 11 includes a select transmission section 111, a capacitor C11, a comparator 112, and a transmission gate T13. The select transmission section 111 includes transmission gates T11 and T12 configured to selectively transmit the pad voltage ZQPAD or the reference voltage VREF to a node nd1 in response to the second period signal PD<2>. The capacitor C11 is coupled between the node nd1 and a node nd2. The comparator 112 is configured to compare a signal of the node nd2 with the reference voltage VREF and output the signal to a node nd3. The transmission gate T13 is configured to transmit the signal of the node nd2 to the node nd3 in response to the first period signal PD<1>.

The comparison signal output unit 12 includes a capacitor C12, an inverter IV11, a transmission gate T14, and an inverter IV12. The capacitor C12 is coupled between the node nd3 and a node nd4. The inverter IV11 is configured to invert and buffer a signal of the node nd4 and output the inverted signal to the node nd5. The transmission gate T14 is configured to transmit the signal of the node nd5 to the node nd4 in response to the third period signal PD<3>. The inverter IV12 is configured to invert and buffer the signal of the node nd5 and output the inverted signal as the comparison signal COM.

The operation of the comparison circuit 1 configured in such a manner will be described as follows. In the following descriptions, it is assumed that the first to third period signals PD<1:3> having the enable periods as shown in FIG. 4 are inputted.

First, since all of the first to third period signals PD<1:3> are enabled to a logic high level in a period tB~tC, the transmission gates T12 to T14 are turned on, and the transmission gate T11 is turned off. The turned-on transmission gate T12 transmits the reference voltage VREF to the node nd1. When the node nd2 is coupled to the node nd3, the voltage of the node nd2 is set to the same level as the reference voltage VREF. This is because, when an output signal of the comparator 112 configured as an operational amplifier is inputted to a negative input terminal (negative feedback), levels of signals inputted to the positive and negative input terminals of the comparator 112 should be equal to each other. However, when the comparator 112 has an offset, the voltage of the node nd2 has a difference ΔV from the reference voltage VREF. Here, the difference ΔV indicates a level difference between the signals inputted to the positive and negative input terminals, which is caused by the offset of the comparator 112. The node nd4 is precharged with an intermediate level between the logic high level and the logic low level by the feedback path formed in the inverter IV11.

Then, during a period tC~tD, the first period signal PD<1> is disabled to a logic low level, and the second and third period signals PD<2:3> are enabled to a logic high level. Therefore, the transmission gates T12 and T14 are turned on, and the transmission gates T11 and T13 are turned off. Since the node nd2 transitions to a floating state by the turned-off transmission gate T13, the capacitor C11 operates as a storage element for storing a voltage difference between the nodes nd1 and nd2, that is, a difference ΔV as offset information.

During a period tD~tE, the first period signal PD<1> and the third period signal PD<3> are disabled to a logic low level, and only the second period PD<2> is enabled to a logic high level. Therefore, the transmission gate T12 is turned on, and the transmission gates T11, T12, and T14 are turned off. The node nd4 transitions to a floating state by the turned-off transmission gate T14 and maintains a precharged level.

During a period after the time point tE, all of the first to third period signals PD<1:3> are disabled to a logic low level. Therefore, the transmission gate T11 is turned on, and the transmission gates T12 to T14 are turned off. Since the pad voltage ZQPAD is transmitted to the node nd1 by the turned-on transmission gate T11, the voltage of the node nd1 varies by the absolute value of a level difference between the reference voltage VREF and the pad voltage ZQPAD. At this time, since the capacitor C11 operates as a coupling element between the node nd1 and the node nd2, the level of the node nd2 also varies by the absolute value of the level difference between the reference voltage VREF and the pad voltage ZQPAD, like the node nd1. Therefore, the comparator 112 may compare the levels of the pad voltage ZQPAD and the reference voltage VREF regardless of an offset, and output a logic level. That is, the comparator 112 outputs a logic low level to the node nd3 when the pad voltage ZQPAD is higher than the reference voltage VREF, and outputs a logic high level to the node nd3 when the pad voltage ZQPAD is lower than the reference voltage VREF. Since the capacitor C12 operates as a coupling element between the node nd3 and the node nd4, the level of the node nd4 varies in the same manner as the node nd3. At this time, since the node nd4 is precharged with an intermediate level between the logic high level and the logic low level, the comparison signal output unit 12 may output the logic level of the node nd3 as the comparison signal COM at high speed.

In accordance with an embodiment of the present invention, the comparison circuit 1 removes an offset occurring in the comparator 112, and generates the comparison signal COM by comparing the levels of the pad voltage ZQPAD and the reference voltage VREF. Therefore, an error based on the offset does not occur in comparing the levels of the pad voltage ZQPAD and the reference voltage VREF. Furthermore, when the comparison circuit 1 is applied to an impedance calibration circuit, impedance mismatching does not occur. Therefore, data may be transmitted at high speed, and may be prevented from being distorted.

Embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:
1. A comparison circuit comprising:
an offset removal unit configured to store offset information of a comparator in response to a reference voltage, receive first to third period signals, and compare a pad voltage with the reference voltage based on the offset information to drive a first node; and a comparison signal output unit configured to buffer a signal of the first node and output a comparison signal for calibrating a resistance value of an on-die termination (ODT) circuit, wherein the first period signal is enabled during a first period, the second period signal is enabled during a second period, the third period signal is enabled during a third period, the first to third periods starting at the same time point.

2. The comparison circuit of claim 1, wherein the offset removal unit comprises a comparator configured to compare a voltage of a second node with the reference voltage and output a signal to the first node.

3. The comparison circuit of claim 2, wherein the offset removal unit transmits the signal of the first node to the second node during the first period, transmits the reference voltage to a third node, and stores a voltage difference between the second node and the third node as the offset information.

4. The comparison circuit of claim 3, wherein the offset removal unit further comprises a storage element coupled between the second node and the third node and configured to store the offset information.

5. The comparison circuit of claim 3, wherein the offset removal unit further comprises a transmission element configured to transmit the signal of the first node to the second node during the first period.

6. The comparison circuit of claim 3, wherein the offset removal unit transmits the pad voltage to the third node from a time point where the second period is ended.

7. The comparison circuit of claim 1, wherein the comparison signal output unit precharges a fourth node in the third period, and buffers and outputs a signal of the fourth node from a time point where the third period is ended.

8. The comparison circuit of claim 7, wherein the comparison signal output unit comprises a coupling element coupled between the fourth node and a fifth node.

9. An impedance calibration circuit comprising:
a comparison circuit configured to receive first to third period signals and generate a comparison signal by comparing a reference voltage and a pad voltage; and
a counter configured to count a code for calibrating a resistance value of an on-die termination (ODT) circuit in response to the comparison signal, and generate the first to third period signals,
wherein the first period signal is enabled during a first period, the second period signal is enabled during a second period, the third period signal is enabled during a third period, the first to third periods starting at the same time point.

10. The impedance calibration circuit of claim 9, the third period is ended after the first period, and the second period is ended after the third period.

11. The impedance calibration circuit of claim 9, wherein the counter comprises:
a shifting unit configured to generate a first detection signal by buffering the comparison signal, and generate a second detection signal by shifting the comparison signal in synchronization with a clock signal;
a clock generation unit configured to buffer the clock signal and generate the buffered signal as a toggling clock signal in response to the first and second detection signals;
a code generation unit configured to generate a toggling code in response to the first detection signal and the code;
a code control unit configured to control the code in response to the toggling code; and
a period signal generation unit configured to generate the first to third period signals in response to the toggling code.

12. The impedance calibration circuit of claim 11, wherein the clock generation unit buffers the clock signal and outputs the buffered signal as the toggling clock signal in a period where the levels of the first and second detection signals are identical.

13. The impedance calibration circuit of claim 11, wherein the first detection signal has a first level when the pad voltage is at a higher level than the reference voltage, and has a second level when the pad voltage is at a lower level than the reference voltage.

14. The impedance calibration circuit of claim 13, wherein the code generation unit generates the toggling clock signal for decreasing the bit number of the code when the first detection signal has the first level, and generates the toggling clock signal for increasing the bit number of the code when the second detection signal has the second level.

15. The impedance calibration circuit of claim 13, wherein the code control unit inverts the level of a first code in response to a first toggling code, and inverts the level of a second code in response to a second toggling code.

16. The impedance calibration circuit of claim 9, wherein the comparison circuit comprises:
an offset removal unit configured to store offset information of a comparator in response to the reference voltage, and compare the pad voltage with the reference voltage based on the offset information to drive a first node; and
a comparison signal output unit configured to buffer a signal of the first node and output the comparison signal.

17. The impedance calibration circuit of claim 16, wherein the offset removal unit comprises a comparator configured to compare a voltage of a second node with the reference voltage and output a signal to the first node.

18. The comparison circuit of claim 17, wherein the offset removal unit transmits the signal of the first node to the second node when the first period signal is enabled, transmits the reference voltage to a third node, and stores a voltage difference between the second node and the third node as the offset information.

19. The comparison circuit of claim 18, wherein the offset removal unit further comprises a storage element coupled between the second node and the third node and configured to store the offset information.

20. The comparison circuit of claim 18, wherein the offset removal unit further comprises a transmission element configured to transmit the signal of the first node to the second node when the first period signal is enabled.

21. The comparison circuit of claim 18, wherein the offset removal unit transmits the pad voltage to the third node when the second period signal is disabled.

22. The comparison circuit of claim 16, wherein the comparison signal output unit precharges a fourth node when the third period signal is enabled, and buffers and outputs a signal of the fourth node when the third period signal is disabled.

23. The comparison circuit of claim 22, wherein the comparison signal output unit comprises a coupling element coupled between the fourth node and a fifth node.

* * * * *